US012684974B2

(12) United States Patent
Jung

(10) Patent No.: US 12,684,974 B2
(45) Date of Patent: Jul. 14, 2026

(54) DISPLAY APPARATUS

(71) Applicant: LG Display Co., Ltd., Seoul (KR)

(72) Inventor: Dong Hun Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 452 days.

(21) Appl. No.: 18/496,392

(22) Filed: Oct. 27, 2023

(65) Prior Publication Data

US 2024/0224658 A1     Jul. 4, 2024

(30) Foreign Application Priority Data

Dec. 29, 2022    (KR) ........................ 10-2022-0188973

(51) Int. Cl.
| | |
|---|---|
| *H10K 59/131* | (2023.01) |
| *H10K 59/124* | (2023.01) |
| *H10K 59/80* | (2023.01) |
| *H10K 59/88* | (2023.01) |

(52) U.S. Cl.
CPC ......... *H10K 59/131* (2023.02); *H10K 59/124* (2023.02); *H10K 59/873* (2023.02); *H10K 59/88* (2023.02)

(58) Field of Classification Search
CPC .. H10K 59/124; H10K 59/131; H10K 59/573; H10K 59/88
See application file for complete search history.

(56) References Cited

U.S. PATENT DOCUMENTS

| | | | |
|---|---|---|---|
| 10,971,571 B2 | 4/2021 | Won et al. | |
| 10,991,782 B2 | 4/2021 | Lee et al. | |
| 11,711,952 B2 | 7/2023 | Shin et al. | |
| 2019/0131379 A1 | 5/2019 | Won et al. | |
| 2019/0237533 A1 | 8/2019 | Kim et al. | |
| 2020/0083307 A1* | 3/2020 | Lee ........................ | H10D 86/40 |
| 2020/0127220 A1 | 4/2020 | Kim et al. | |
| 2021/0119177 A1 | 4/2021 | Bang et al. | |
| 2021/0257437 A1 | 8/2021 | Shin et al. | |

FOREIGN PATENT DOCUMENTS

| | | |
|---|---|---|
| CN | 109728040 A | 5/2019 |
| JP | 2019-083195 A | 5/2019 |
| JP | 2020-043058 A | 3/2020 |
| KR | 10-2021-0105469 A | 8/2021 |

OTHER PUBLICATIONS

Japan Patent Office, Office Action, Japanese Patent Application No. 2023-218027, Feb. 4, 2025, nine pages.

* cited by examiner

*Primary Examiner* — Daniel P Shook
(74) *Attorney, Agent, or Firm* — Fenwick & West LLP

(57) ABSTRACT

A display apparatus includes a device substrate with a display area and a bezel area, an upper planarization layer on the device substrate, an upper interlayer insulating layer between the device substrate and the upper planarization layer, a dam pattern, a light-emitting device, a pad portion on the bezel area, link wirings extending across the display area and the bezel area between the device substrate and the upper interlayer insulating layer, and a power voltage supply line on the upper interlayer insulating layer. The power voltage supply line may include a main wiring and an external connecting wiring. The main wiring may be spaced apart from the encapsulating dam. The external connecting wiring is electrically connected to the main wiring.

27 Claims, 7 Drawing Sheets

DISPLAY APPARATUS

CROSS-REFERENCE TO RELATED APPLICATIONS

This application claims the benefit of Republic of Korea Patent Application No. 10-2022-0188973, filed on Dec. 29, 2022, which is hereby incorporated by reference in its entirety.

TECHNICAL FIELD

The present disclosure relates to an apparatus and particularly to, for example, without limitation, a display apparatus in which a display area and a pad portion are electrically connected by link wirings.

DISCUSSION OF THE RELATED ART

Generally, a display apparatus provides an image to a user. For example, the display apparatus may include light-emitting devices on a device substrate. Each of the light-emitting devices may emit light displaying a specific color (e.g., white, red, green, blue, cyan, magenta, or yellow, etc.) For example, each of the light-emitting devices may have a stacked structure of a first electrode, a second electrode and a light-emitting layer which is positioned between the first electrode and second electrode.

The device substrate may include a display area in which the light-emitting devices are disposed, and a bezel area disposed outside the display area. The bezel area may include a pad portion for transferring a signal applied from the outside to the display area, and may be also referred to as non-display area NDA. For example, link wirings electrically connecting the display area and the pad portion may be disposed on the bezel area of the device substrate.

The description provided in the background section should not be assumed to be prior art merely because it is mentioned in or associated with the background section. The background section may include information that describes one or more aspects of the subject technology.

SUMMARY

As recognized by the inventor, a power voltage supply line supplying a power voltage to the display area to the operation of each light-emitting device may intersect the link wirings. For example, the power voltage supply line may be disposed on an upper interlayer insulating layer covering the link wirings. However, the upper interlayer insulating layer may have a thickness difference due to the link wirings. Since an organic insulating layer is not disposed around an encapsulating dam formed between the display area and the pad portion, a residual layer may be generated due to a thickness difference of the upper interlayer insulating layer around the encapsulating dam. The residual layer generated in a process of forming the power voltage supply line, which is a conductive material, may be vaporized and/or diffused in a subsequent process. Therefore, in the display apparatus, the light-emitting devices formed after the power voltage supply line may be deteriorated or lowered due to the residual layer.

Therefore, the inventors of the present disclosure recognized the problems mentioned above and other limitations associated with the related art, and conducted various experiments to implement a display apparatus that substantially obviates one or more limitations due to limitations and disadvantages of the related art.

An object of the present disclosure is to provide a display apparatus capable of reducing or preventing the generation of the residual layer due to the process of forming the power voltage supply line around the encapsulating dam on the bezel area.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, in one embodiment, a display apparatus comprises a device substrate. The device substrate includes a display area configured to display an image and a bezel area that does not display the image, the display area including a pixel area. The display apparatus further includes an upper planarization layer on the display area of the device substrate, and an upper interlayer insulating layer between the device substrate and the upper planarization layer. The upper interlayer insulating layer extends across the display area and the bezel area of the device substrate. The display apparatus further includes a first dam pattern on the upper interlayer insulating layer on the bezel area. The first dam pattern is spaced apart from the upper planarization layer. The display apparatus further includes a light-emitting device on the pixel area of the display area. The light-emitting device includes a first electrode, a light-emitting layer and a second electrode. The first electrode is on the upper planarization layer, the light-emitting layer is on the first electrode, and the second electrode is on the light-emitting layer.

The display apparatus also includes a pad portion on the bezel area of the device substrate, and link wirings between the device substrate and the upper interlayer insulating layer. The link wirings extend across the display area and the bezel area and are electrically connected to the pad portion. The display apparatus also includes a power voltage supply line on the upper interlayer insulating layer. The power voltage supply line extends across the display area and the bezel area, and is electrically connected to the pad portion. The power voltage supply line includes a main wiring that is non-overlapping the first dam pattern on the bezel area, and an external connecting wiring electrically connected to the main wiring on the bezel area.

In one embodiment, a display apparatus includes a display area configured to display an image, a bezel area surrounding the display area, a pad portion in the bezel area, and at least one encapsulating dam in the bezel area. The at least one encapsulating dam extends along an edge of the display area. The display apparatus also includes a power voltage supply line electrically connecting the display area and the pad portion. The power voltage supply line includes a main wiring non-overlapping the at least one encapsulating dam in the bezel area, and an external connecting wiring electrically connected to the main wiring in the bezel area.

In one embodiment, a display apparatus includes a substrate having a display area and a bezel area, and a light-emitting element in the display area on the substrate. The light-emitting element includes a first electrode, a second electrode, and a light-emitting layer between the first electrode and the second electrode. The light-emitting layer is configured to emit light for displaying the image. The display apparatus also includes a pad on the substrate in the bezel area, a dam on the substrate in the bezel area, and a power voltage supply line. The power voltage supply line extends from the display area to the pad and is configured to provide power supplied from the pad to the display area. The power voltage supply line includes a first wiring. The first wiring includes a first end and a second end. The second end non-overlaps with the dam. The power voltage supply line further includes a second wiring electrically connected to the second end of the first wiring.

In the display apparatus according to the exemplary embodiments of the present disclosure, after removing the conductive material for forming the main wiring around the first dam pattern, the external connecting wiring electrically connected to the main wiring may be formed by a subsequent process. Thus, in the display apparatus according to the exemplary embodiments of the present disclosure, the generation of the residual layer due to the thickness difference generated by the link wirings in a process of forming the main wiring may be reduced or prevented. Thereby, in the display apparatus according to the exemplary embodiments of the present disclosure, the deterioration of the light-emitting devices due to the residual layer of the conductive material may be reduced or prevented. And, in the display apparatus according to the exemplary embodiments of the present disclosure, the production energy may be reduced by process optimization.

Technical benefits of the present disclosure are not limited to the above-mentioned benefits.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

Figure 1:
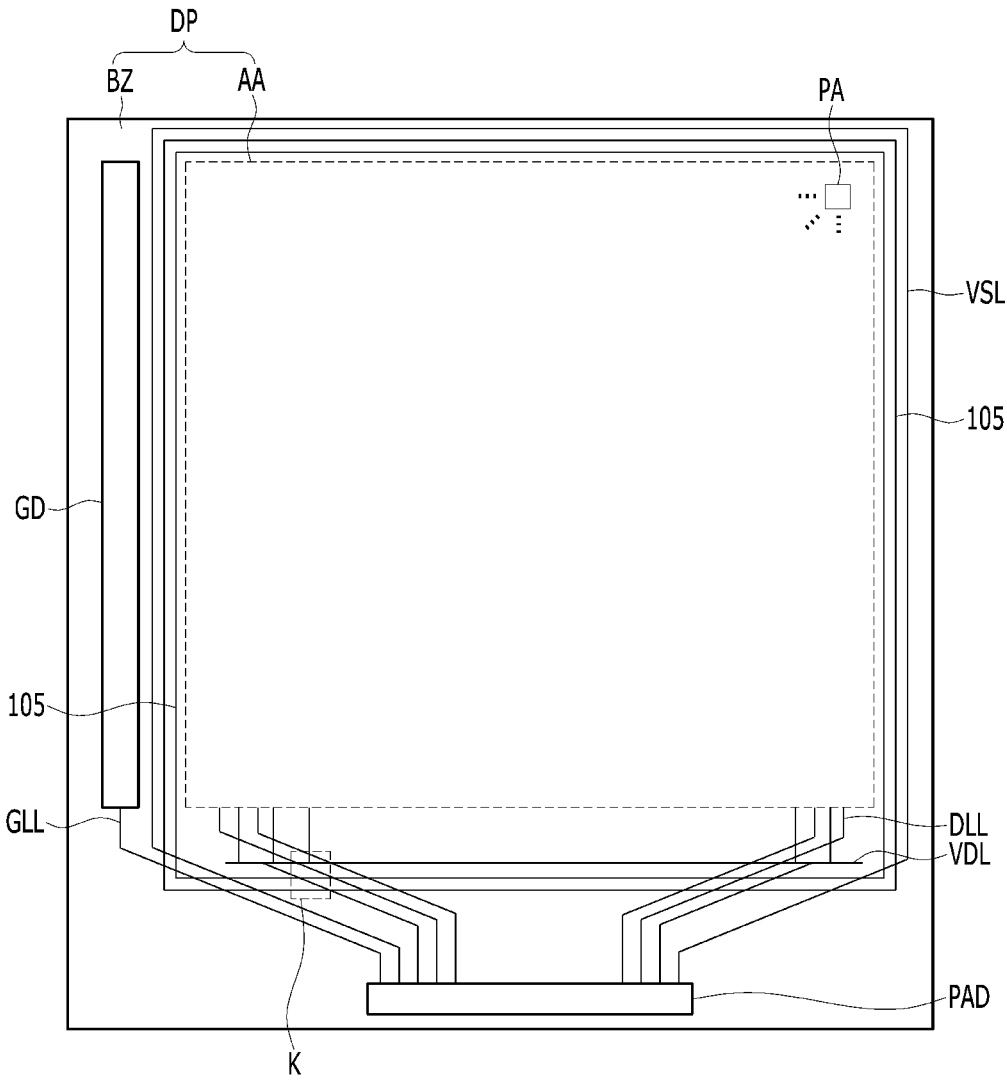
FIG. 1 is a view schematically showing a display apparatus according to an exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF THE INVENTION

Hereinafter, details related to the above objects, technical configurations, and operational effects of the exemplary embodiments of the present disclosure will be clearly understood by the following detailed description with reference to the drawings, which illustrate some embodiments of the present disclosure. Here, the exemplary embodiments of the present disclosure are provided in order to allow the technical sprit of the present disclosure to be satisfactorily transferred to those skilled in the art, and thus the present disclosure may be embodied in other forms and is not limited to the exemplary embodiments described below. In the following description, when a detailed description of well-known functions or configurations related to this document is determined to unnecessarily cloud a gist of the inventive concept, the detailed description thereof will be omitted. Names of the respective elements used in the following explanations may be selected only for convenience of writing the specification and may be thus different from those used in actual products.

In addition, the same or extremely similar elements may be designated by the same reference numerals throughout the specification and in the drawings, the relative size, the lengths and thickness of layers and regions may be exaggerated for clarity, illustration, and convenience. It will be understood that, when a first element is referred to as being "on" a second element, although the first element may be disposed on the second element so as to come into contact with the second element, a third element may be interposed between the first element and the second element. For example, when a position relation between two parts is described as, for example, "on," "over," "under," or "next," one or more other parts may be disposed between the two parts unless a more limiting term, such as "just" or "direct(ly)," is used.

Here, terms such as, for example, "first" and "second" may be merely used to distinguish any one element with another element, these elements should not be interpreted to be limited by these terms as they are not used to define a particular order or precedence. For example, a first element could be termed a second element, and, similarly, a second element could be termed a first element, without departing from the scope of the present disclosure. That is, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises", "have" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected", "coupled" or "adhered" to another component or layer may include that two components or layer are "connected", "coupled" or "adhered" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Embodiment

Figure 2:
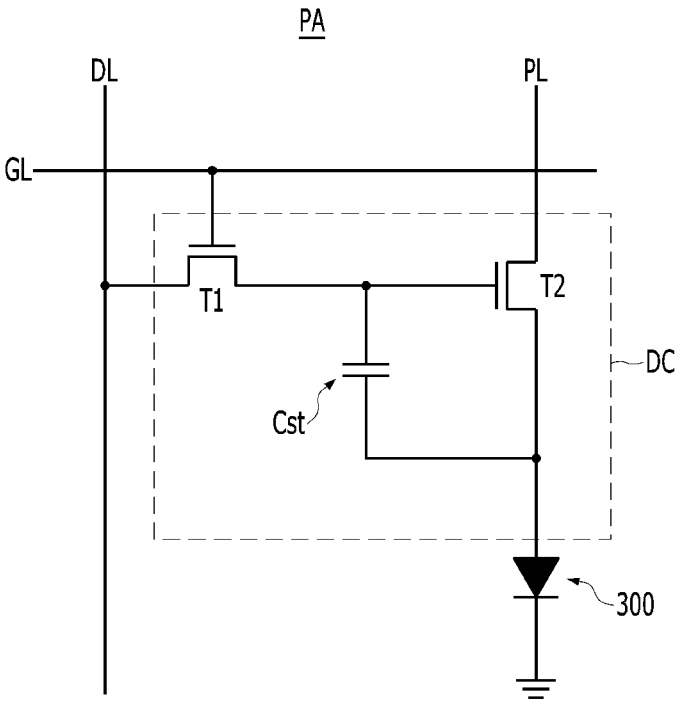
FIG. 2 is a view showing a circuit of a unit pixel area in the display apparatus according to the exemplary embodiment of the present disclosure.
Figure 3:
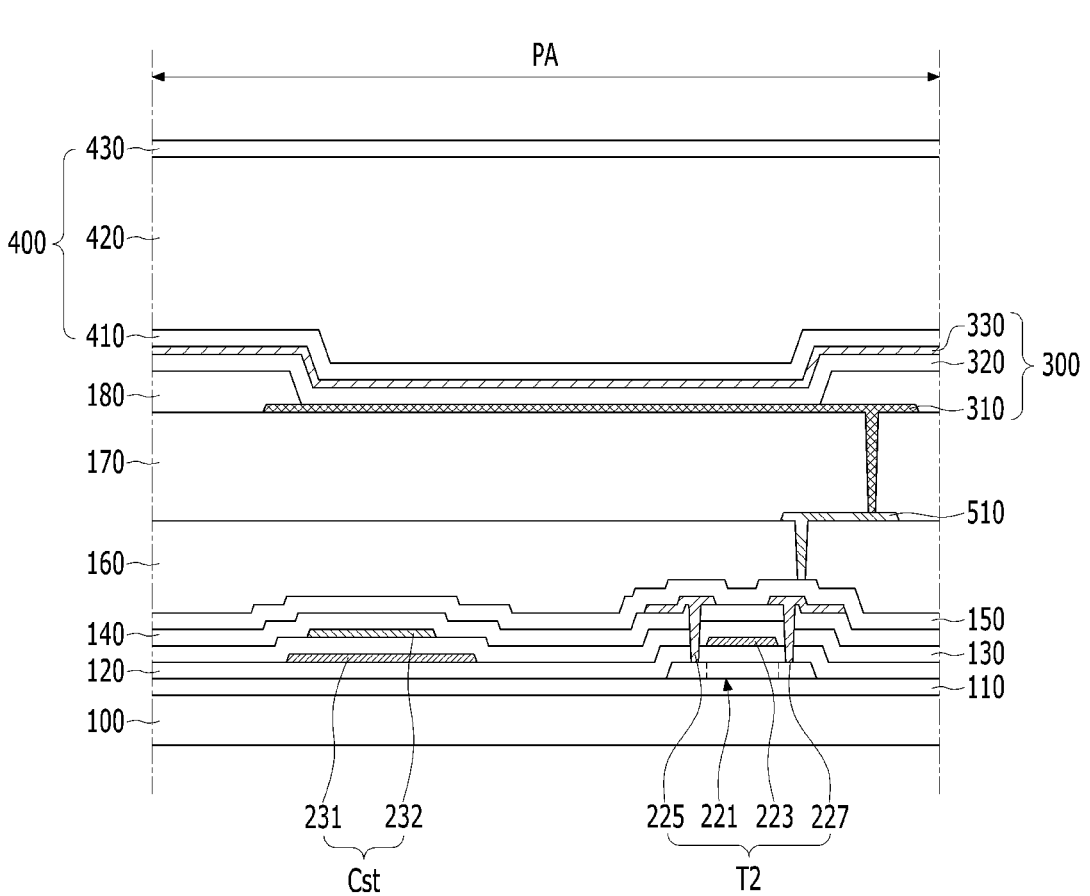
FIG. 3 is a view schematically showing a cross-section of the pixel area in the display apparatus according to the exemplary embodiment of the present disclosure.

FIG. 1 is a view schematically showing a display apparatus according to an exemplary embodiment of the present disclosure. FIG. 2 is a view showing a circuit of a unit pixel area in the display apparatus according to the exemplary embodiment of the present disclosure. FIG. 3 is a view schematically showing a cross-section of the pixel area in the display apparatus according to the exemplary embodiment of the present disclosure.

Referring to FIGS. 1 to 3, the display apparatus according to the exemplary embodiment of the present disclosure may include a display panel DP. The display panel DP may generate an image provided to a user. For example, the display panel DP may include a plurality of pixel area PA defined by intersections between a plurality of gate lines and a plurality of data lines.

Various signals may be provided in each pixel area PA through signal wirings GL, DL and PL. For example, the signal wirings GL, DL and PL may include gate lines GL applying a gate signal to each pixel area PA, data lines DL applying a data signal to each pixel area PA, and power lines PL supplying a positive power voltage to each pixel area PA. The gate lines GL may be electrically connected to a gate driver GD, and the data lines DL may be electrically connected to a data driver (not shown). The power lines PL may be electrically connected to a power unit.

The gate driver GD and the data driver may be controlled by a timing controller. For example, the gate driver GD may receive clock signals, reset signals, a start signal, output enable signal, and the like from the timing controller, and the data driver may receive digital video data, source shift clock signal, a source output enable signal, a source timing signal, and the like from the timing controller.

Each of the pixel areas PA may realize a specific color (e.g., white, red, green, blue, cyan, magenta, or yellow, etc.) For example, a light-emitting device 300 and a pixel driving circuit DC electrically connected to the light-emitting device 300 may be disposed in each pixel area PA. The light-emitting device 300 and the pixel driving circuit DC of each pixel area PA may be disposed on a device substrate 100. The device substrate 100 may include an insulating material. According to exemplary embodiments of the present disclosure, the device substrate 100 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

The light-emitting device 300 may emit light displaying a specific color. For example, the light-emitting device 300 may have a stacked structure of a first electrode 310, a second electrode 330 and a light-emitting layer 320 which is positioned between the first electrode 310 and second electrode 330.

The first electrode 310 may include a conductive material. The first electrode 310 may include a material having a high reflectance. For example, the first electrode 310 may be a metal, such as aluminum (Al) and silver (Ag). The first electrode 310 may have a multilayer structure. For example, the first electrode 310 may have a structure in which a reflective electrode made of a metal is disposed between transparent electrodes made of a transparent conductive material, such as ITO and IZO. For example, pure silver (Ag) may react with oxygen or nitrogen so that the reflectance may be lowered. Therefore, the first electrode 310 may be formed of a multiple layers of ITO/Ag/ITO or formed by adding impurities such as palladium (Pd) or copper (Cu). the first electrode 310 may be disposed on the upper planarization layer 170, may be electrically connected to the source/drain electrodes SE/DE of a second thin film transistor T2, and may be formed of a material different from that of the source/drain electrodes SE/DE, but not limited thereto.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the exemplary embodiment of the present disclosure may be an organic light-emitting display apparatus including an organic emission material.

The light-emitting layer 320 may have a multilayer structure. For example, the light-emitting layer 320 may further include at least one of a hole injection layer (HIL), a hole transport layer (HTL), an electron transport layer (ETL) and an electron injection layer (EIL). Thus, in the display apparatus according to the exemplary embodiment of the present disclosure, the emission efficiency of the light-emitting layer 320 may be improved.

The second electrode 330 may include a conductive material. The second electrode 330 may include a material different from the first electrode 310. A transmittance of the second electrode 330 may be higher than a transmittance of the first electrode 310. For example, the second electrode 330 may be a transparent electrode made of a transparent conductive material, such as ITO and IZO. Thus, in the display apparatus (top emission type) according to the exemplary embodiment of the present disclosure, the light generated by the light-emitting layer 320 may be emitted outside through the second electrode 330. On the other hand, but the exemplary embodiments of the present disclosure are not limited thereto, depending on the light emitting direction (e.g., bottom emission type), the transmittance of the second electrode 330 may be lower than a transmittance of the first electrode 310.

The pixel driving circuit DC may supply a driving current corresponding to the data signal to the light-emitting device 300 according to a gate signal for one frame. For example, the pixel driving circuit DC may include a first thin film transistor T1, a second thin film transistor T2 and a storage capacitor Cst. Each of the first thin film transistor T1, and second thin film transistor T2 may be embodied as a PMOS transistor which turns on when the gate voltage is at a low level, while each of the first thin film transistor T1, and second thin film transistor T2 may be embodied as an NMOS transistor which turns on when the gate voltage is at a high level. In addition, a number of storage capacitors may be one or more, for example, the pixel circuit of the present disclosure also may be a 3T1C pixel circuit including three TFTs and one storage capacitor, a 3T2C pixel circuit including three TFTs and two storage capacitors, a 5T1C pixel circuit including five TFTs and one storage capacitor, a 5T2C pixel circuit including five TFTs and two storage capacitors, a 7T2C pixel circuit including seven TFTs and two storage capacitors, or the like.

The first thin film transistor T1 may include a first semiconductor pattern, a first gate electrode, a first source electrode and a first drain electrode. The first thin film transistor T1 may transmit the data signal to gate electrode of the second thin film transistor T2 according to the gate signal. For example, the first thin film transistor T1 may function as a switching thin film transistor. The first gate electrode of the first thin film transistor T1 may be electrically connected to one of the gate lines GL, and the first source electrode of the first thin film transistor T1 may be electrically connected to one of the data lines DL and the first drain electrode of the first thin film transistor T1 may be electrically connected to gate electrode of the second thin film transistor T2.

The first semiconductor pattern may include a semiconductor material, the first semiconductor pattern may include amorphous silicon (a-Si), polycrystalline silicon (poly-Si) or an oxide semiconductor, such as IGZO. Specifically, the oxide semiconductors may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. As another example, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto. In addition, the first semiconductor pattern may include a first source region, a first channel region and a first drain region. The first channel region may be disposed between the first source region and the first drain region. A resistance of the first source region may be smaller than a resistance of the first channel region, and a resistance of the first drain region may be smaller than a resistance of the first channel region. For example, the first source region and the first drain region may include a conductive region of an oxide semiconductor. The oxide semiconductor may be selectively conductorized by ion doping an intrinsic polycrystalline semiconductor pattern with impurity ions of Group V or Group III, for example, phosphorus (P) or boron (B) at a predetermined concentration. The first channel region may be a region of an oxide semiconductor, which is not conductorized.

The first gate electrode may include a conductive material. For example, the first gate electrode may be a single layer or multiple layers made of any one of a metal, such as aluminum (Al), chrome (Cr), copper (Cu), molybdenum (Mo), titanium (Ti), nickel (Ni), neodymium (Nd) and tungsten (W) or an alloy thereof, but the present disclosure is not limited thereto. The first gate electrode may be disposed on the first semiconductor pattern. For example, the first gate electrode may overlap the first channel region of the first semiconductor pattern. The first source region and the first drain region of the first semiconductor pattern may be disposed outside the first gate electrode. The first gate electrode may be insulated from the first semiconductor pattern by a gate insulating layer. For example, the gate insulating layer may include silicon oxide (SiOx) and/or silicon nitride (SiNx), and the gate insulating layer may include a material having a high dielectric constant. For example, the gate insulating layer may include a high-K material, such as hafnium oxide (HfO). The gate insulating layer may have a multilayer structure. For example, the first source region of the first semiconductor pattern may be electrically connected to the first drain region of the first semiconductor pattern via the first channel region according to the gate signal.

The first source electrode may be a single layer or multiple layers made of a conductive material. For example, the first source electrode may include a metal, such as aluminum (Al), gold (Au), neodymium (Nd), chrome (Cr), copper (Cu), molybdenum (Mo), titanium (Ti), tungsten (W) or the like. The first source electrode may include a material different from the first gate electrode. The first source electrode may be disposed on a layer different from the first gate electrode. For example, the first source electrode may be insulated from the first gate electrode. The first source electrode may be electrically connected to the first source region of the first semiconductor pattern via a contact hole passing through one or more insulating layers.

The first drain electrode may be a single layer or multiple layers made of a conductive material. For example, the first drain electrode may include a metal, such as aluminum (Al), gold (Au), neodymium (Nd), chrome (Cr), copper (Cu), molybdenum (Mo), titanium (Ti), tungsten (W) or the like. The first drain electrode may include a material different from the first gate electrode. The first drain electrode may be disposed on a layer different from the first gate electrode. For example, the first drain electrode may be disposed on a same layer as the first source electrode. The first drain electrode may include a same or substantially same material as the first source electrode. The first drain electrode may be insulated from the first gate electrode. The first drain electrode may be electrically connected to the first drain region of the first semiconductor pattern via a contact hole passing through one or more insulating layers.

The second thin film transistor T2 may at least include a second semiconductor pattern 221, a second gate electrode 223, a second source electrode 225 and a second drain electrode 227. The second thin film transistor T2 may generate the driving current corresponding to the data signal. For example, the second thin film transistor T2 may function as a driving thin film transistor. The second gate electrode 223 may be electrically connected to the first drain electrode of the first thin film transistor T1, and the second source electrode 225 may be electrically connected to one of the power lines PL. The light-emitting device 300 may be electrically connected to the second thin film transistor T2. For example, the second drain electrode 227 may be electrically connected to the first electrode 310 of the light-emitting device 300, and the second electrode 330 of the light-emitting device 300 may be electrically connected to ground.

The second semiconductor pattern 221 may include a semiconductor material. For example, the second semiconductor pattern 221 may include amorphous silicon (a-Si), polycrystalline silicon (poly-Si) or an oxide semiconductor. For example, the oxide semiconductor material may be formed of any one of indium gallium zinc oxide (IGZO), indium zinc oxide (IZO), indium gallium tin oxide (IGTO), and indium gallium oxide (IGO), but is not limited thereto. The second semiconductor pattern 221 may include a second channel region, through which electrons or holes move, between a second source region and a second drain region. The second channel region may have a resistance larger than the second source region and a second drain region. For example, the second source region and the second drain region may include a conductive region of an oxide semiconductor, and the second channel region may be a region of an oxide semiconductor, which is not conductorized. As an example, the second source region and second drain region may be formed by doping on an intrinsic polycrystalline semiconductor pattern with impurity ions of Group V or Group III, for example, phosphorus (P) or boron (B) at a predetermined concentration.

The second semiconductor pattern 221 may be disposed on a same layer as the first semiconductor pattern. The second semiconductor pattern 221 may include a same or substantially same material as the first semiconductor pattern. For example, the second semiconductor pattern 221 may be formed simultaneously with the first semiconductor pattern in the same process.

The second gate electrode 223 may include a conductive material. For example, the second gate electrode 223 may be a single layer or multiple layers made of any one of a metal, such as aluminum (Al), chrome (Cr), copper (Cu), molybdenum (Mo), titanium (Ti), nickel (Ni), neodymium (Nd) and tungsten (W) or an alloy thereof, but the present disclosure is not limited thereto. The second gate electrode 223 may be disposed on a same layer as the first gate electrode. The second gate electrode 223 may include a same or substantially same material as the first gate electrode. For example, the second gate electrode 223 may be formed simultaneously with the first gate electrode.

The second gate electrode 223 may be disposed on the second semiconductor pattern 221 with a gate insulating layer 120 being interposed therebetween. For example, the second gate electrode 223 may overlap the second channel region of the second semiconductor pattern 221. The second source region and the second drain region of the second semiconductor pattern 221 may be disposed outside the second gate electrode 223. The second gate electrode 223 may be insulated from the second semiconductor pattern 221 by the gate insulating layer 120. For example, the gate insulating layer 120 may include silicon oxide (SiOx) and/or silicon nitride (SiNx), and the gate insulating layer 120 may include a material having a high dielectric constant. For example, the gate insulating layer 120 may include a high-K material, such as hafnium oxide (HfO). The gate insulating layer 120 may have a multilayer structure. For example, the second channel region of the second semiconductor pattern 221 may have an electrical conductivity corresponding to a voltage applied to the second gate electrode 223.

The second source electrode 225 may be a single layer or multiple layers made of a conductive material. For example, the second source electrode 225 may include a metal, such as aluminum (Al), gold (Au), neodymium (Nd), chrome (Cr), copper (Cu), molybdenum (Mo), titanium (Ti), tungsten (W) or the like. The second source electrode 225 may include a material different from the second gate electrode 223. The second source electrode 225 may be disposed on a layer different from the second gate electrode 223. For example, the second source electrode 225 may be insulated from the second gate electrode 223. The second source electrode 225 may be electrically connected to the second source region of the second semiconductor pattern 221 via a contact hole passing through one or more insulating layers.

The second source electrode 225 may be disposed on a same layer as the first source electrode. The second source electrode 225 may include a same or substantially same material as the first source electrode. For example, the second source electrode 225 may be formed simultaneously with the first source electrode in the same process.

The second drain electrode 227 may be a single layer or multiple layers made of a conductive material. For example, the second drain electrode 227 may include a metal, such as aluminum (Al), gold (Au), neodymium (Nd), chrome (Cr), copper (Cu), molybdenum (Mo), titanium (Ti), tungsten (W) or the like. The second drain electrode 227 may include a material different from the second gate electrode 223. The second drain electrode 227 may be disposed on a layer different from the second gate electrode 223. For example, the second drain electrode 227 may be disposed on a same layer as the second source electrode. The second drain electrode may include a same or substantially same material as the second source electrode. For example, the second drain electrode 227 may be insulated from the second gate electrode 223. The second drain electrode 227 may be electrically connected to the second drain region of the second semiconductor pattern 221 via a contact hole passing through one or more insulating layers.

The second drain electrode 227 may be disposed on a same layer as the first drain electrode. The second drain electrode 227 may include a same or substantially same material as the first drain electrode. For example, the second drain electrode 227 may be formed simultaneously with the first drain electrode.

The storage capacitor Cst may maintain a signal applied to the second gate electrode 223 of the second thin film transistor T2 for one frame. For example, the storage capacitor Cst may be electrically connected between the second gate electrode 223 and the second drain electrode 227 of the second thin film transistor T2. The storage capacitor Cst may have a stacked structure of capacitor electrodes 231 and 232. For example, the storage capacitor Cst may include a first capacitor electrode 231 and a second capacitor electrode 232. At least one of the capacitor electrodes 231 and 232 may be formed by using a process of forming the first thin film transistor T1 and the second thin film transistor T2. For example, the first capacitor electrode 231 may include a same or substantially same material as the second gate electrode 223, as an example, the first capacitor electrode 231 may be deposited on the gate insulating layer 120 along with the second gate electrode 223 in the process of forming the second gate electrode 223 of the second thin film transistor T2. The second capacitor electrode 232 may include a material different from the second source electrode 225 and the second drain electrode 227. For example, the second capacitor electrode 232 may be disposed on a layer different from the second source electrode 225 and the second drain electrode 227.

A plurality of insulating layers 110, 120, 130, 140, 150, 160, 170 and 180 for reducing or preventing unnecessary electrical connection in each pixel area PA may be disposed on the device substrate 100. For example, a buffer insulating layer 110, a gate insulating layer 120, a lower interlayer insulating layer 130, an upper interlayer insulating layer 140, a device passivation layer 150, a lower planarization layer 160, an upper planarization layer 170 and a bank insulating layer 180 may be disposed on the device substrate 100.

The buffer insulating layer 110 may be disposed close to the device substrate 100. The buffer insulating layer 110 may reduce or prevent pollution due to the device substrate 100 in a process of forming the pixel driving circuit DC in each pixel area PA. For example, an upper surface of the device substrate 100 toward the pixel driving circuit DC of each pixel area PA may be completely covered by the buffer insulating layer 110. The first thin film transistor T1, the second thin film transistor T2 and the storage capacitor Cst of each pixel area PA may be disposed on the buffer insulating layer 110. The buffer insulating layer 110 may include an insulating material. For example, the buffer insulating layer 110 may include an inorganic insulating material, such as silicon oxide (SiOx) and silicon nitride (SiNx). As an example, the buffer insulating layer 110 may be formed by an inorganic film in a single layer or in multiple layers, the buffer insulating layer 110 in a single layer may be a silicon oxide (SiOx) film or a silicon nitride (SiNx) film, and buffer insulating layer 110 in multiple layers may formed by alternately stacking one or more silicon oxide (SiOx) films, one or more silicon nitride (SiNx) films, and one or more amorphous silicon (a-Si), but the present disclosure is not limited thereto.

The gate insulating layer 120 may be disposed on the buffer insulating layer 110. The gate insulating layer 120 may insulate the gate electrodes 223 of each thin film transistor T1 and T2 from the corresponding second semiconductor pattern 221. For example, the gate insulating layer 120 may cover the first semiconductor pattern and the second semiconductor pattern 221 of each pixel area PA. The first gate electrode and the second gate electrode 223 of each pixel area PA may be disposed on the gate insulating layer 120. The first capacitor electrode 231 of each pixel area PA may be disposed on the gate insulating layer 120. The gate insulating layer 120 may include an insulating material. For example, the gate insulating layer 120 may include an inorganic insulating material, such as silicon oxide (SiOx) and silicon nitride (SiNx). The gate insulating layer 120 may be composed of a single layer or multilayers of silicon oxide SiOx or silicon nitride SiNx, but not limited thereto.

The lower interlayer insulating layer 130 and the upper interlayer insulating layer 140 may insulate the source electrodes 225 and the drain electrodes 227 of each thin film transistor T1 and T2 from the gate electrode 223 of the corresponding thin film transistor T1 and T2. The upper interlayer insulating layer 140 may be disposed on the lower interlayer insulating layer 130. For example, the lower interlayer insulating layer 130 may cover the first gate electrode and the second gate electrode 223 of each pixel area PA and the first capacitor electrode 231 of the storage capacitor Cst. The first source electrode, the first drain electrode, the second source electrode 225 and the second drain electrode 227 of each pixel area PA may be disposed on the upper interlayer insulating layer 140. The lower interlayer insulating layer 130 and the upper interlayer insulating layer 140 may include an insulating material. For example, the lower interlayer insulating layer 130 and the upper interlayer insulating layer 140 may include an inorganic insulating material, such as silicon oxide (SiOx) and silicon nitride (SiNx). As an example, each of the lower interlayer insulating layer 130 and the upper interlayer insulating layer 140 may be comprised of a plurality of stacked layers each of which is made of silicon oxide (SiO2) or silicon nitride (SiNx). In particular, each of the lower interlayer insulating layer 130 and the upper interlayer insulating layer 140 may include a silicon nitride (SiNx) layer containing hydrogen particles. The upper interlayer insulating layer 140 may include a material different from the lower interlayer insulating layer 130. Thus, in the display apparatus according to the exemplary embodiment of the present disclosure, the stability of the pixel driving circuit DC may be improved. The second capacitor electrode 232 of each pixel area PA may be disposed between the lower interlayer insulating layer 130 and the upper interlayer insulating layer 140.

The device passivation layer 150 may be disposed on the upper interlayer insulating layer 140. The device passivation layer 150 may reduce or prevent damage of the pixel driving circuit in each pixel area PA due to external impact and moisture. For example, the first source electrode, the first drain electrode, the second source electrode 225 and the second drain electrode 227 of each pixel area PA may be covered by the device passivation layer 150. The device passivation layer 150 may include an insulating material. For example, the device passivation layer 150 may be an inorganic insulating material, such as silicon oxide (SiOx) and silicon nitride (SiNx). For example, the device passivation layer 150, which is a kind of dielectric (e.g., an inorganic dielectric), may be constituted by a single layer made of a silicon oxide (SiOx) film, a silicon nitride (SiNx) film, or a silicon oxynitride (SiOxNy) film or a multilayer film thereof, etc. Depending on circumstances, device passivation layer 150 may be omitted when other layers have a function of protecting the thin film transistor TFT.

The lower planarization layer 160 and the upper planarization layer 170 may be sequentially stacked on the device passivation layer 150 to planarize the upper portion of the device passivation layer 150. For example, the lower planarization layer 160 may be disposed between the device passivation layer 150 and the upper planarization layer 170. The lower planarization layer 160 and the upper planarization layer 170 may remove a thickness difference due to the pixel driving circuit DC of each pixel area PA. For example, an upper surface of the upper planarization layer 170 opposite to the device substrate 100 may be a flat surface. The lower planarization layer 160 and the upper planarization layer 170 may include an insulating material. The lower planarization layer 160 and the upper planarization layer 170 may include a material different from the device passivation layer 150. For example, the lower planarization layer 160 and the upper planarization layer 170 may include an organic insulating material, such as acrylic resin, epoxy resin, phenolic resin, polyamides resin, unsaturated polyesters resin, polyphenylene resin, polyphenylene sulfides resin, benzocyclobutene, or the like, but embodiments are not limited thereto. The upper planarization layer 170 may include a same or substantially same material as the lower planarization layer 160. The upper planarization layer 170 may be in direct contact with an upper surface of the lower planarization layer 160 opposite to the device substrate 100. For example, a boundary surface between the lower planarization layer 160 and the upper planarization layer 170 may not be recognized.

The light-emitting device 300 of each pixel area PA may be disposed on the upper planarization layer 170. For example, the first electrode 310, the light-emitting layer 320 and the second electrode 330 of each pixel area PA may be sequentially stacked on the upper planarization layer 170 in the corresponding pixel area PA. The first electrode 310 of each pixel area PA may be in direct contact with the upper surface of the upper planarization layer 170. Thus, in the display apparatus according to the exemplary embodiment of the present disclosure, luminance deviation according to a generation position of the light emitted from each light-emitting device 300 may be reduced or prevented.

Intermediate electrodes 510 may be disposed between the lower planarization layer 160 and the upper planarization layer 170 so as to be connected to the second thin film transistor T2 through a contact hole formed in a lower planarization layer 160. The intermediate electrodes 510 may include a conductive material. For example, the intermediate electrodes 510 may include a metal, such as aluminum (Al), chrome (Cr), copper (Cu), molybdenum (Mo), titanium (Ti) and tungsten (W). The first electrode 310 of each pixel area PA may be electrically connected to the second drain electrode 227 of the corresponding pixel area PA through one of the intermediate electrodes 510. For example, each of the intermediate electrodes 510 may be in direct contact with the second drain electrode 227 of each pixel area PA by penetrating the lower planarization layer 160 of the corresponding pixel area PA, and the first electrode 310 of each pixel area PA may be in direct contact with one of the intermediate electrodes 510 by penetrating the upper planarization layer 170 of the corresponding pixel area PA.

The bank insulating layer 180 may be disposed on the upper planarization layer 170 and at least a part of first electrode 310. The bank insulating layer 180 may define an emission area in each pixel area PA. For example, the bank insulating layer 180 may cover an edge of the first electrode 310 in each pixel area PA. The light-emitting layer 320 and the second electrode 330 of each pixel area PA may be sequentially stacked on a portion of the corresponding first electrode 310 exposed by the bank insulating layer 180. The bank insulating layer 180 may include an insulating material. For example, the bank insulating layer 180 may be an organic insulating material. The bank insulating layer 180 may include a material different from the upper planarization layer 170. Optionally, a spacer may be disposed on the bank insulating layer 180 to reduce or prevent a damage caused by a contact with a deposition mask.

At least a portion of the light-emitting layer 320 of each pixel area PA may extend onto the bank insulating layer 180. For example, at least one of the hole injection layer (HIL), the hole transport layer (HTL), the electron transport layer (ETL) and the electron injection layer (EIL) in each pixel area PA may be formed on an entire surface of a display area AA. Thus, in the display apparatus according to the exemplary embodiment of the present disclosure, the process efficiency may be improved, but the present disclosure is not limited thereto.

At least a portion of the light-emitting layer 320 of each pixel area PA may extend outside the corresponding pixel area PA. For example, at least one of the hole injection layer (HIL), the hole transport layer (HTL), the electron transport layer (ETL) and the electron injection layer (EIL) in each pixel area PA may extend on the bank insulating layer 180. At least one of the hole injection layer (HIL), the hole transport layer (HTL), the electron transport layer (ETL) and the electron injection layer (EIL) in each pixel area PA may be formed simultaneously with the corresponding layer of adjacent pixel area PA. For example, at least one of the hole injection layer (HIL), the hole transport layer (HTL), the electron transport layer (ETL) and the electron injection layer (EIL) may be formed on the entire surface of the display area AA. Thus, in the display apparatus according to the exemplary embodiment of the present disclosure, the process efficiency may be improved.

A voltage applied to the second electrode 330 of each pixel area PA may be a same as or similar to a voltage applied to the second electrode 330 of adjacent pixel area PA. For example, a negative power voltage may be applied to the second electrode 330 of each pixel area PA. The second electrode 330 of each pixel area PA may be electrically connected to the second electrode 330 of adjacent pixel area PA. The second electrode 330 of each pixel area PA may include a same or substantially same material as the second electrode 330 of adjacent pixel area PA. For example, the second electrode 330 of each pixel area PA may be formed simultaneously with the second electrode 330 of adjacent pixel area PA. The second electrode 330 of each pixel area PA may be in direct contact with the second electrode 330 of adjacent pixel area PA. For example, the second electrode 330 of each pixel area PA may extend outside the corresponding pixel area PA. Thus, in the display apparatus according to the exemplary embodiment of the present disclosure, a process of forming the second electrode 330 in each pixel area PA may be simplified. Therefore, in the display apparatus according to the exemplary embodiment of the present disclosure, the process efficiency may be improved. And, in the display apparatus according to the exemplary embodiment of the present disclosure, the luminance of the light emitted from the light-emitting device 300 of each pixel area PA may be adjusted by the data signal applied to the pixel driving circuit DC of the corresponding pixel area PA.

An encapsulation unit 400 may be disposed on the light-emitting device 300 of each pixel area PA. The encapsulation unit 400 may reduce or prevent damage to the light-emitting devices 300 due to external moisture, oxygen impurities and impact. For example, the light-emitting device 300 of each pixel area PA may be completely covered by the encapsulation unit 400. The encapsulation unit 400 may have a single layer or multilayer structure. For example, The encapsulation unit 400 in single layer structure may be formed of an inorganic material, such as silicon nitride or aluminum oxide. As an example, the encapsulation unit 400 in multilayer structure may include a first encapsulating layer 410, a second encapsulating layer 420 and a third encapsulating layer 430, which are sequentially stacked. The first encapsulating layer 410, the second encapsulating layer 420 and the third encapsulating layer 430 may include an insulating material. For example, the first encapsulating layer 410 may be disposed on the second electrode 330 (e.g., a cathode), the second encapsulating layer 420 may include a material different from the first encapsulating layer 410 and the third encapsulating layer 430. For example, the first encapsulating layer 410 and the third encapsulating layer 430 may be an inorganic insulating material, such as silicon nitride or silicon oxide, and the second encapsulating layer 420 may be an organic insulating material. Thus, in the display apparatus according to the exemplary embodiment of the present disclosure, the damage of the light-emitting devices 300 due to the external moisture, oxidization and impact may be effectively reduced or prevented. A thickness difference due to the light-emitting devices 300 may be removed by the second encapsulating layer 420. For example, an upper surface of the encapsulation unit 400 opposite to the device substrate 100 may be a flat surface on the pixel areas PA.

The display panel DP may include the display area AA in which the pixel areas PA are disposed, and a bezel area BZ disposed outside the display area AA. At least one of the gate driver GD, the data driver, the power unit and the timing controller may be disposed on the bezel area BZ of the display panel DP. For example, the display apparatus according to the exemplary embodiment of the present disclosure may be a GIP (Gate In Panel) type display apparatus in which the gate driver GD is formed on the bezel area BZ of the display panel DP. However, embodiments are not limited thereto, at least one of the gate driver GD, the data driver, the power unit and the timing controller may be connected to the device substrate 100 in a manner of tape carrier package (TCP) or chip on film (COF)

A pad portion PAD may be disposed in the bezel area BZ. A signal applied from the outside of the device substrate 100 may be transmitted to the display area AA through the pad portion PAD. For example, at least one gate link wiring GLL electrically connecting the pad portion PAD to the gate driver GD, and data link wirings DLL electrically connecting the pad portion PAD to the display area AA may be disposed on the device substrate 100. Each of the data lines DL may be electrically connected to one of the data link wirings DLL. For example, the data driver may apply the data signal to each pixel area PA through the pad portion PAD, the data link wirings DLL and the data lines DL. Likewise, each of the gate lines GL may be electrically connected to one of the gate link wiring GLL. For example, the gate driver may apply the gate signal to each pixel area PA through the pad portion PAD, the gate link wiring GLL and the gate lines GL.

Figure 4:
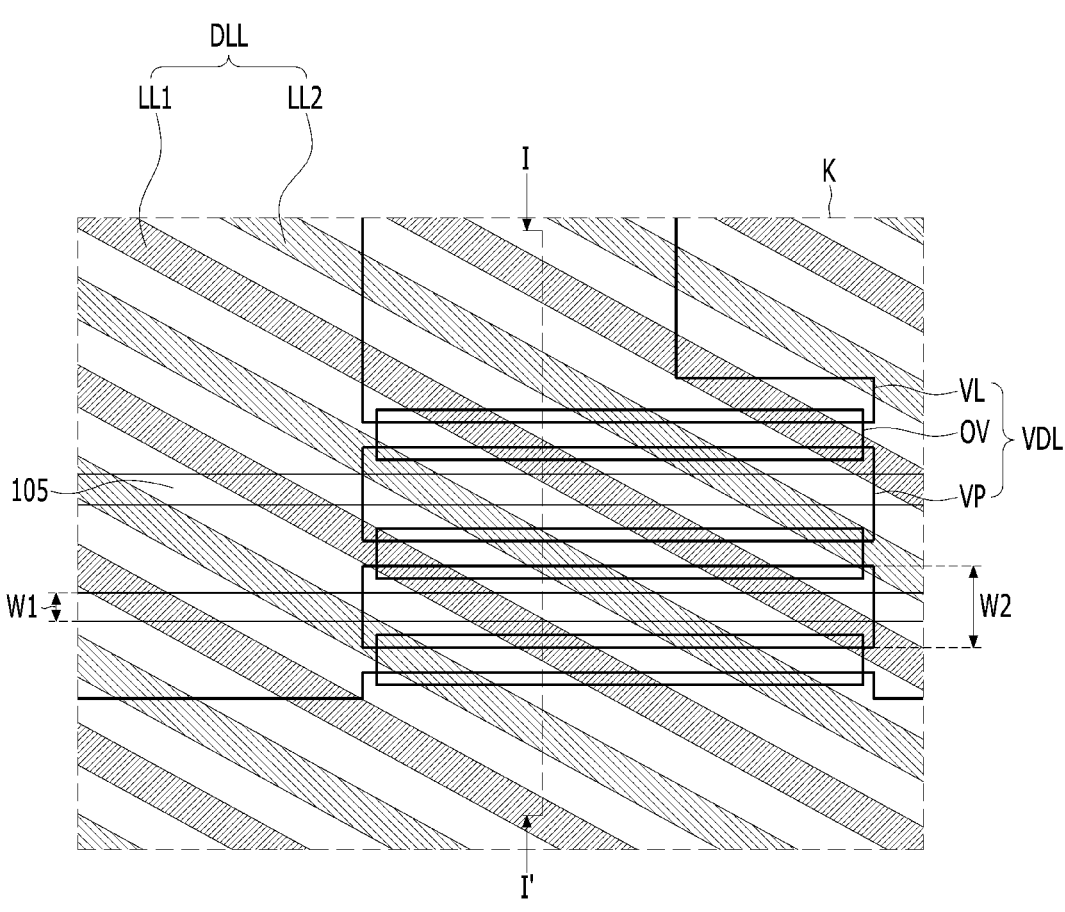
FIG. 4 is an enlarged view of K region in FIG. 1 according to an exemplary embodiment of the present disclosure.
Figure 5:
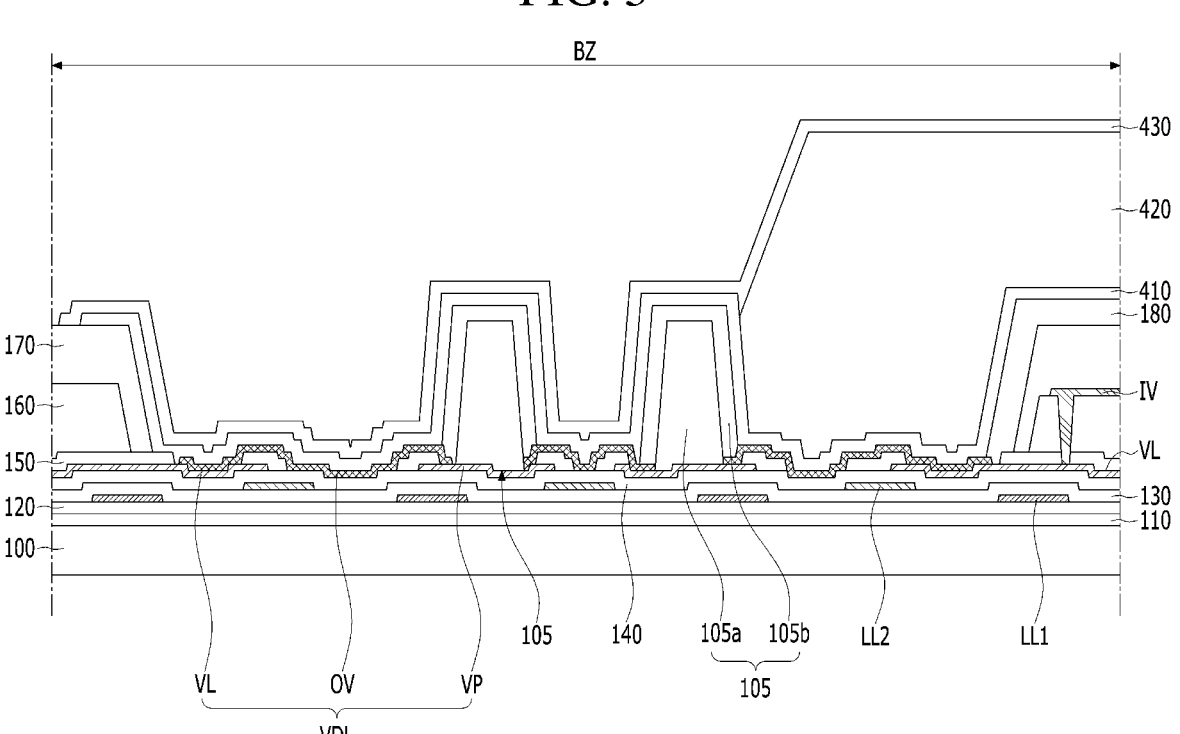
FIG. 5 is a view taken along I-I' of FIG. 4 according to an exemplary embodiment of the present disclosure.

FIG. 4 is an enlarged view of K region in FIG. 1. FIG. 5 is a view taken along I-I' of FIG. 4. As illustrated in FIGS. 1-5, the display apparatus includes a substrate 100 having a display area AA and a bezel area BZ, a pad PAD, an encapsulation dam 105, and a first power voltage supply line VDL. The first power voltage supply line VDL includes a first wiring (e.g., main wiring VL) and a second wiring (e.g., external connecting wiring OV). The first wiring includes a first end and a second end. The second end is electrically connected to the second wiring. The second end does not overlap with the dam 105. In some embodiments, the power voltage supply line VDL further includes a third wiring (e.g. external dummy pattern VP) electrically connected to the second wiring. The third wiring overlaps the dam 105.

Further, the data link wirings DLL of the display apparatus according to the exemplary embodiment of the present disclosure may include first links LL1 and second links LL2. The second links LL2 may be disposed between the first links LL1. The second links LL2 may include a material different from the first links LL1. The second links LL2 may be disposed on a layer different from the layer where the first links LL1 is disposed. The data link wirings DLL may be formed by using a process of forming the pixel driving circuit DC of each pixel area PA. For example, the first links LL1 may be formed simultaneously with the first capacitor electrode 231 of each pixel area PA, and the second links LL2 may be formed simultaneously with the second capacitor electrode 232 of each pixel area PA. The first links LL1 may include a same or substantially same material as the first capacitor electrode 231 of each pixel area PA, and the second links LL2 may include a same or substantially same material as the second capacitor electrode 232 of each pixel area PA. Thus, in the display apparatus according to the exemplary embodiment of the present disclosure, an area occupied by the data link wirings DLL may be reduced or minimized, without decreasing the process efficiency.

In the display apparatus according to the exemplary embodiment of the present disclosure, a portion of the plurality of insulating layers 110, 120, 130, 140, 150, 160, 170 and 180 may extend on the bezel area BZ of the device substrate 100. For example, in the display apparatus according to the exemplary embodiment of the present disclosure, the buffer insulating layer 110, the gate insulating layer 120, the lower interlayer insulating layer 130, the upper interlayer insulating layer 140 and the device passivation layer 150 may extend on the bezel area BZ of the device substrate 100. The first links LL1 may be disposed on a same layer as the first capacitor electrode 231 of each pixel area PA. For example, the first links LL1 may be disposed between the gate insulating layer 120 and the lower interlayer insulating layer 130. The second links LL2 may be disposed on a same layer as the second capacitor electrode 232 of each pixel area PA. For example, the second links LL2 may be disposed between the lower interlayer insulating layer 130 and the upper interlayer insulating layer 140. Thus, in the display apparatus according to the exemplary embodiment of the present disclosure, the first links LL1 and the second links LL2 of the data link wirings DLL, which are disposed side by side may be insulated, without decreasing the process efficiency. But embodiments are not limited thereto, the first links LL1 may not be disposed on a same layer as the first capacitor electrode 231 of each pixel area PA, and the second links LL2 may not be disposed on a same layer as the second capacitor electrode 232 of each pixel area PA.

At least one encapsulating dam 105 may be disposed on the bezel area BZ. The encapsulating dam 105 may block a flow of the second encapsulating layer 420, which is an organic insulating layer. For example, the second encapsulating layer 420 may be formed in a region defined by the encapsulating dam 105. The encapsulating dam 105 may extend along an edge of the display area AA. The encapsulating dam 105 may be disposed between the display area AA and the gate driver GD. The encapsulating dam 105 may cross between the display area AA and the pad portion PAD. Thus, in the display apparatus according to the exemplary embodiment of the present disclosure, a malfunction of the gate driver GD by the second encapsulating layer 420 may be reduced or prevented. And, in the display apparatus according to the exemplary embodiment of the present disclosure, the distortion of a signal applied through the pad portion PAD due to the second encapsulation layer 420 may be reduced or prevented. Therefore, in the display apparatus according to the exemplary embodiment of the present disclosure, the reliability may be improved.

Figure 6:
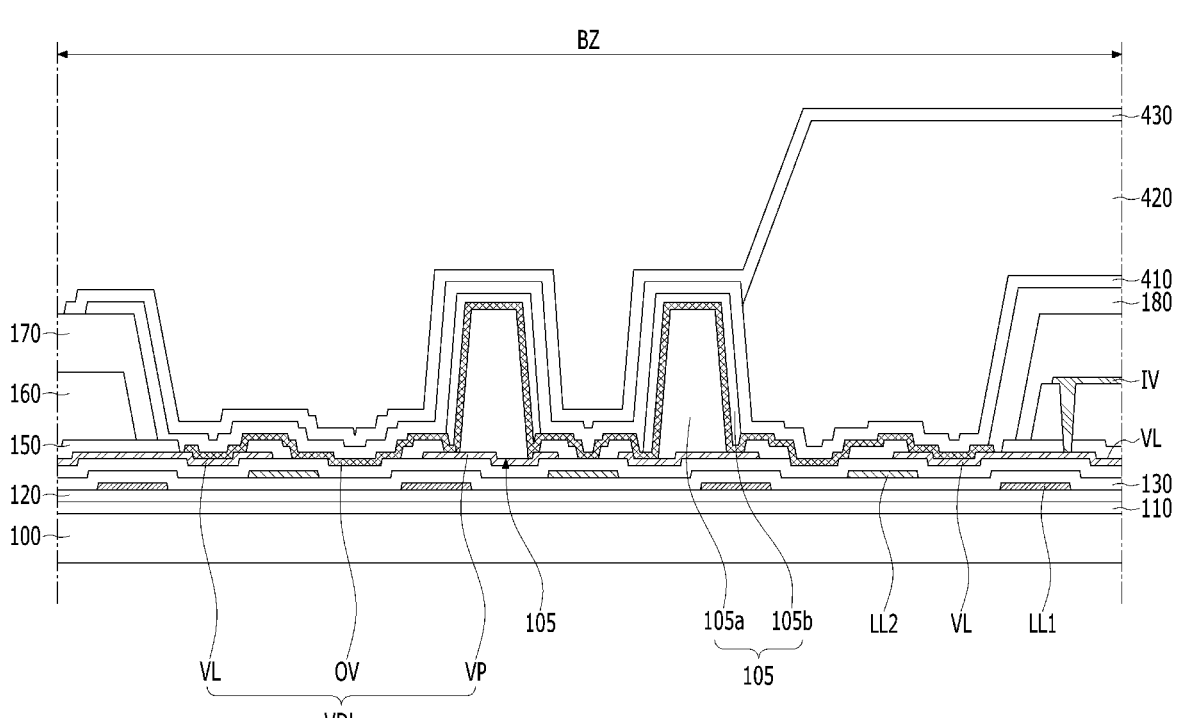
FIG. 6, FIG. 7, FIG. 8 and FIG. 9 are views showing the display apparatus according to other embodiments of the present disclosure.

The encapsulating dam 105 may be formed by using a process of forming the insulating layers 110, 120, 130, 140, 150, 160, 170 and 180, which are stacked on the device substrate 100. For example, the encapsulating dam 105 may include a first dam pattern 105a formed simultaneously with the upper planarization layer 170 and a second dam pattern 105b formed simultaneously with the bank insulating layer 180. The first dam pattern 105a may have a same or substantially same thickness as the upper planarization layer 170. An upper surface of the second dam pattern 105b opposite to the device substrate 100 may have a same or substantially same level as an upper surface of the bank insulating layer 180 opposite to the device substrate 100. For example, the first dam pattern 105a may be covered by the second dam pattern 105b. The encapsulating dam 105 may be spaced apart from the lower planarization layer 160, the upper planarization layer 170 and the bank insulating layer 180. For example, a step of forming the encapsulating dam 105 may include a step of removing the lower planarization layer 160, the upper planarization layer 170 and the bank insulating layer 180 around the encapsulating dam 105. The lower planarization layer 160, the upper planarization layer 170 and the bank insulating layer 180 may be not disposed around the encapsulating dam 105. Thus, in the display apparatus according to the exemplary embodiment of the present disclosure, the flow of the second encapsulating layer 420 may be effectively blocked by the encapsulating dam 105. The first encapsulating layer 410 and the third encapsulating layer 430 may extend beyond the encapsulating dam 105. For example, the third encapsulating layer 430 may be in direct contact with the first encapsulating layer 410 at the outside of the encapsulating dam 105 which may be formed surrounding the display area AA. In this exemplary embodiment, two encapsulating dams 105 are shown in FIGS. 5 and 6, however, the number of encapsulating dams 105 may be more or less depending on the actual requirements.

A first power voltage supply line VDL for applying the positive power voltage to the pixel driving circuit DC of each pixel area PA and a second power voltage supply line VSL for applying the negative power voltage to the second electrode 330 of each pixel area PA may be disposed on the bezel area BZ. The second power voltage supply line VSL may be electrically connected to the second electrode 330 at the outside of the display area AA. For example, the second power voltage supply line VSL may extend along an edge of the display area AA. The second power voltage supply line VSL may extend at the outside of the encapsulating dam 105. That is, in the display apparatus according to the exemplary embodiment of the present disclosure, the second electrode 330 may be electrically connected to the second power voltage supply line VSL by penetrating only the first encapsulating layer 410 and the third encapsulating layer 430. Thus, in the display apparatus according to the exemplary embodiment of the present disclosure, a process of connecting the second electrode 330 to the second power voltage supply line VSL may be simplified.

The power lines PL may be electrically connected to the first power voltage supply line VDL. For example, the first power voltage supply line VDL may electrically connect between the pad portion PAD and the display area AA. The first power voltage supply line VDL may cross the encapsulating dam 105. For example, the first power voltage supply line VDL may extend in a first direction between the display area AA and the pad portion PAD, the encapsulating dam 105 may extend in a second direction perpendicular to the first direction. The first power voltage supply line VDL may intersect the data link wirings DLL. For example, the first power voltage supply line VDL may cross a plurality of the first links LL1 and a plurality of the second link LL2 between the display area AA and the pad portion PAD.

The first power voltage supply line VDL may be insulated from the data link wirings DLL. For example, the upper interlayer insulating layer 140 may be disposed between the data link wirings DLL (e.g., second link LL2) and the first power voltage supply line VDL, and the upper interlayer insulating layer 140 and lower interlayer insulating layer 130 may be disposed between the data link wirings DLL (e.g., first link LL1) and the first power voltage supply line VDL. The first power voltage supply line VDL may include a main wiring VL, an external connecting wiring OV and an external dummy pattern VP.

The main wiring VL may be disposed on a same layer as the second source electrode 225 and the second drain electrode 227 of each pixel area PA. For example, the main wiring VL may be disposed between the upper interlayer insulating layer 140 and the device passivation layer 150, and second source electrode 225 and the second drain electrode 227 of each pixel area PA may be disposed between the upper interlayer insulating layer 140 and the device passivation layer 150 as well. The main wiring VL may include a same or substantially same material as the second source electrode 225 and the second drain electrode 227 of each pixel area PA. For example, the main wiring VL may be formed simultaneously with the second source electrode 225 and the second drain electrode 227 of each pixel area PA. The main wiring VL may be spaced apart from the encapsulating dam 105. For example, the main wiring VL may be separated from and formed around the encapsulating dam 105. An end of the main wiring VL may be covered by the device passivation layer 150.

The main wiring VL separated from and formed around the encapsulating dam 105 may be electrically connected to the external connecting wiring OV and the external dummy pattern VP. For example, the external dummy pattern VP may be disposed between the upper interlayer insulating layer 140 and the encapsulating dam 105, and the external connecting wiring OV may electrically connect between the main wiring VL and the external dummy pattern VP. The external dummy pattern VP disposed under each encapsulating dam 105 may be spaced apart from the external dummy pattern VP disposed under adjacent encapsulating dam 105. For example, the external dummy patterns VP may be connected by the external connecting wiring OV between a plurality of the encapsulating dams 105. Thus, in the display apparatus according to the exemplary embodiment of the present disclosure, the generation of the residual layer, which is a conductive material around the encapsulating dam 105 may be reduced or minimized.

The external dummy pattern VP may include a same or substantially same material as the main wiring VL. For example, the external dummy pattern VP may be formed simultaneously with the main wiring VL. The external connecting wiring OV may include a material different from the main wiring VL and the external dummy pattern VP. The external connecting wiring OV may be disposed on a layer different from the main wiring VL and the external dummy pattern VP. For example, the external connecting wiring OV may be disposed on the device passivation layer 150. The external connecting wiring OV may be formed by using a process of forming the light-emitting devices 300. For example, the external connecting wiring OV may be formed simultaneously with the first electrode 310 of each light-emitting device 300. The external connecting wiring OV may include a same or substantially same material as the first electrode 310 of each light-emitting device 300. Thus, in the display apparatus according to the exemplary embodiment of the present disclosure, a subsequent process of the external connecting wiring OV may be performed at a relatively low temperature. That is, in the display apparatus according to the exemplary embodiment of the present disclosure, even if the residual layer of the conductive material is generated in a process of forming the external connecting wiring OV, the residual layer of the conductive material may be not vaporized by the subsequent process of the external connecting wiring OV. Therefore, in the display apparatus according to the exemplary embodiment of the present disclosure, the deterioration of the light-emitting devices 300 due to the residual layer of the external connecting wiring OV may be reduced or prevented.

The external connecting wiring OV may be covered by the first encapsulating layer 410 and the third encapsulating layer 430. Thus, in the display apparatus according to the exemplary embodiment of the present disclosure, the penetration of the external moisture through the external connecting wiring OV may be reduced or prevented. Therefore, in the display apparatus according to the exemplary embodiment of the present disclosure, the reliability and the stability of the pixel driving circuit DC in each pixel area PA may be improved.

The external connecting wiring OV may be in direct contact with a portion of an upper surface of the main wiring VL opposite to the device substrate 100 and a portion of an upper surface of the external dummy pattern VP opposite to the device substrate 100. For example, a portion of the device passivation layer 150 disposed around the encapsulating dam 105 may be removed. For example, the encapsulating dam 105 may be in direct contact with the upper surface of the external dummy pattern VP opposite to the device substrate 100. Thus, in the display apparatus according to the exemplary embodiment of the present disclosure, an interval caused by thickness differences due to the data link wirings DLL may be formed to be relatively wide. Therefore, in the display apparatus according to the exemplary embodiment of the present disclosure, the residual layer of a conductive material generated in a process of forming the external connecting wiring OV may be reduced or minimized.

The external dummy pattern VP and the external connecting wiring OV may have a shape extending in a same or substantially same direction as the encapsulating dam 105. For example, the external dummy pattern VP and the external connecting wiring OV may have a bar shape extending in the second direction. As shown in FIG. 4, a width W2 of the external dummy pattern VP in the first direction may be greater than a width W1 of the encapsulating dam 105 in the first direction. For example, the external connecting wiring OV may be in direct contact with the external dummy pattern VP at the outside the encapsulating dam 105. An end of the external connecting wiring OV may be covered by the second dam pattern 105b surrounding the encapsulating dam 105. Thus, in the display apparatus according to the exemplary embodiment of the present disclosure, a process of connecting the external connecting wiring OV to the external dummy pattern VP may be simplified.

Accordingly, the display apparatus according to the exemplary embodiment of the present disclosure may include the main wiring VL and the external connecting wiring OV. The main wiring VL may be removed around the encapsulating dam 105 on the bezel area BZ, and the external connecting wiring OV may be electrically connected to the main wiring VL. In one embodiment of the present disclosure, the external connecting wiring OV may be formed simultaneously with the first electrode 310 of each pixel area PA. Thus, in the display apparatus according to the exemplary embodiment of the present disclosure, the generation of the residual layer of a conductive material used in a process of forming the main wiring VL may be reduced or prevented. And, in the display apparatus according to the exemplary embodiment of the present disclosure, the deterioration of the light-emitting devices 300 due to the residual layer of a conductive material used in a process of forming the external connecting wiring OV may be reduced or prevented. Therefore, in the display apparatus according to the exemplary embodiment of the present disclosure, the generation of the residual layer due to the thickness differences by the data link wirings DLL may be reduced or prevented. That is, in the display apparatus according to the exemplary embodiment of the present disclosure, the deterioration of the light-emitting devices 300 due to the residual layer of a conductive material may be reduced or prevented.

In the display apparatus according to the exemplary embodiment of the present disclosure, an internal dummy wiring IV may be disposed between the lower planarization layer 160 and the upper planarization layer 170. The internal dummy wiring IV may include a same or substantially same material as the intermediate electrodes 510. For example, the internal dummy wiring IV may be formed simultaneously with the intermediate electrodes 510. The internal dummy wiring IV may be electrically connected to the main wiring VL at a location between the device substrate 100 and the lower planarization layer 160. That is, in the display apparatus according to the exemplary embodiment of the present disclosure, the internal dummy wiring IV may function as the first power voltage supply line VDL between the encapsulating dam 105 and the display area AA. Thus, in the display apparatus according to the exemplary embodiment of the present disclosure, a voltage drop of the positive power voltage applied through the first power voltage supply line VDL may be reduced or minimized. Therefore, in the display apparatus according to the exemplary embodiment of the present disclosure, the luminance deviation due to the voltage drop may be reduced or prevented.

The display apparatus according to the exemplary embodiment of the present disclosure is described that the external connecting wiring OV is disposed outside the first dam pattern 105a. However, in the display apparatus according to another embodiment of the present disclosure, the external connecting wiring OV may extend along a surface of the first dam pattern 105a, as shown in FIG. 6. A portion of the external connecting wiring OV disposed on the surface of the first dam pattern 105a may be covered by the second dam pattern 105b. Thus, in the display apparatus according to another embodiment of the present disclosure, the stability of the positive power voltage applied through the first power voltage supply line VDL may be improved. And, in the display apparatus according to another embodiment of the present disclosure, a resistance of the first power voltage supply line around the encapsulating dam 105 may be reduced or minimized. That is, in the display apparatus according to another embodiment of the present disclosure, increasing the resistance of the first power voltage supply line VDL due to the main wiring VL separated from and around the encapsulating dam 105 may be reduced or prevented. Therefore, in the display apparatus according to another embodiment of the present disclosure, the luminance deviation due to the voltage drop may be effectively reduced or prevented.

Figure 7:
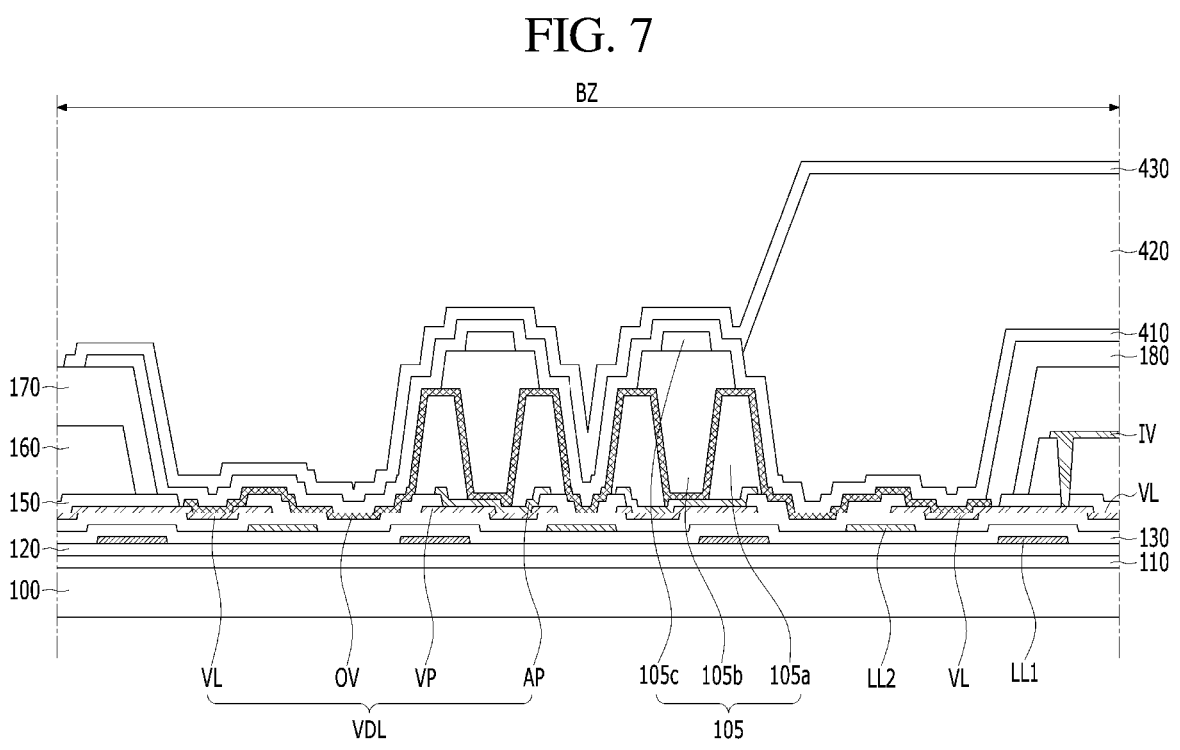

The display apparatus according to the exemplary embodiment of the present disclosure is described that the external connecting wiring OV is connected to the external dummy pattern VP at the outside of the encapsulating dam 105. However, in the display apparatus according to another embodiment of the present disclosure, the external connecting wiring OV and the external dummy pattern VP may be connected to each other in various ways. For example, in the display apparatus according to another embodiment of the present disclosure, the external connecting wiring OV may be electrically connected to the external dummy pattern VP between two first dam pattern 105a covering an end of the external dummy pattern VP, as shown in FIG. 7. A connection point between the external connecting wiring OV and the external dummy pattern VP may be covered by the second dam pattern 105b. Thus, in the display apparatus according to another embodiment of the present disclosure, the degree of freedom for a connection method between the external connecting wiring OV and the external dummy pattern VP may be improved.

In the display apparatus according to another embodiment of the present disclosure, as shown in FIG. 7, the encapsulating dam 105 may include a third dam pattern 105c on the second dam pattern 105b. The third dam pattern 105c may include a same or substantially same material as a spacer formed on the bank insulating layer 180. Thus, in the display apparatus according to another embodiment of the present disclosure, the degree of freedom for a shape of the encapsulating dam 105 may be improved.

In the display apparatus according to another embodiment of the present disclosure, as shown in FIG. 7, the first power voltage supply line VDL may further includes a fourth wiring (e.g., an auxiliary dummy pattern AP). The auxiliary dummy pattern AP may be disposed on the external dummy pattern VP. An end of the auxiliary dummy pattern AP may be disposed on the device passivation layer 150 covering an end of the external dummy pattern VP. For example, the auxiliary dummy pattern AP may be disposed on a same layer as the internal dummy wiring IV. The auxiliary dummy pattern AP may include a same or substantially same material as the internal dummy wiring IV. For example, the auxiliary dummy pattern AP may be formed simultaneously with the internal dummy wiring IV. The external connecting wiring OV may be electrically connected to the external dummy pattern VP through the auxiliary dummy pattern AP. For example, the external connecting wiring OV may be in direct contact with a portion of the auxiliary dummy pattern AP. Thus, in the display apparatus according to another embodiment of the present disclosure, the external connecting wiring OV may be stably connected to the external dummy pattern VP. And, in the display apparatus according to another embodiment of the present disclosure, a resistance of the first power voltage supply line VDL may be reduced or minimized around the encapsulating dam 105. Therefore, in the display apparatus according to another embodiment of the present disclosure, a voltage drop of a positive power voltage may be reduced or minimized.

Figure 8:
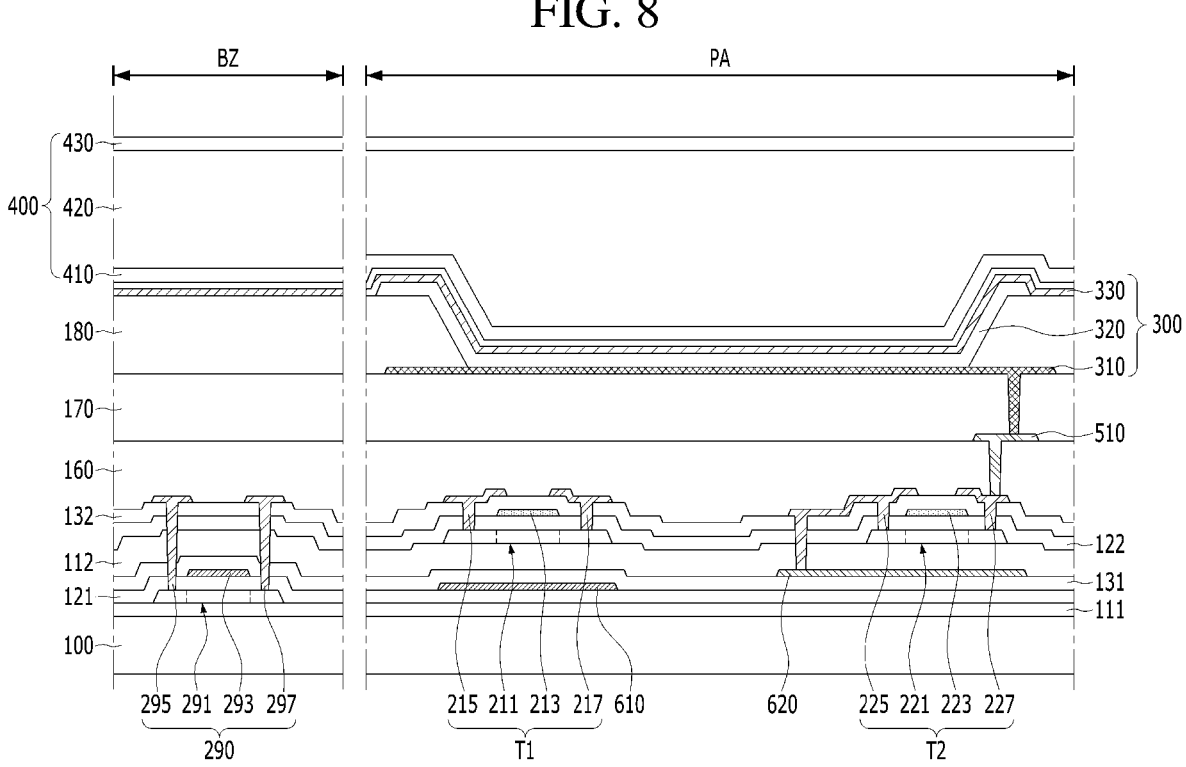
Figure 9:
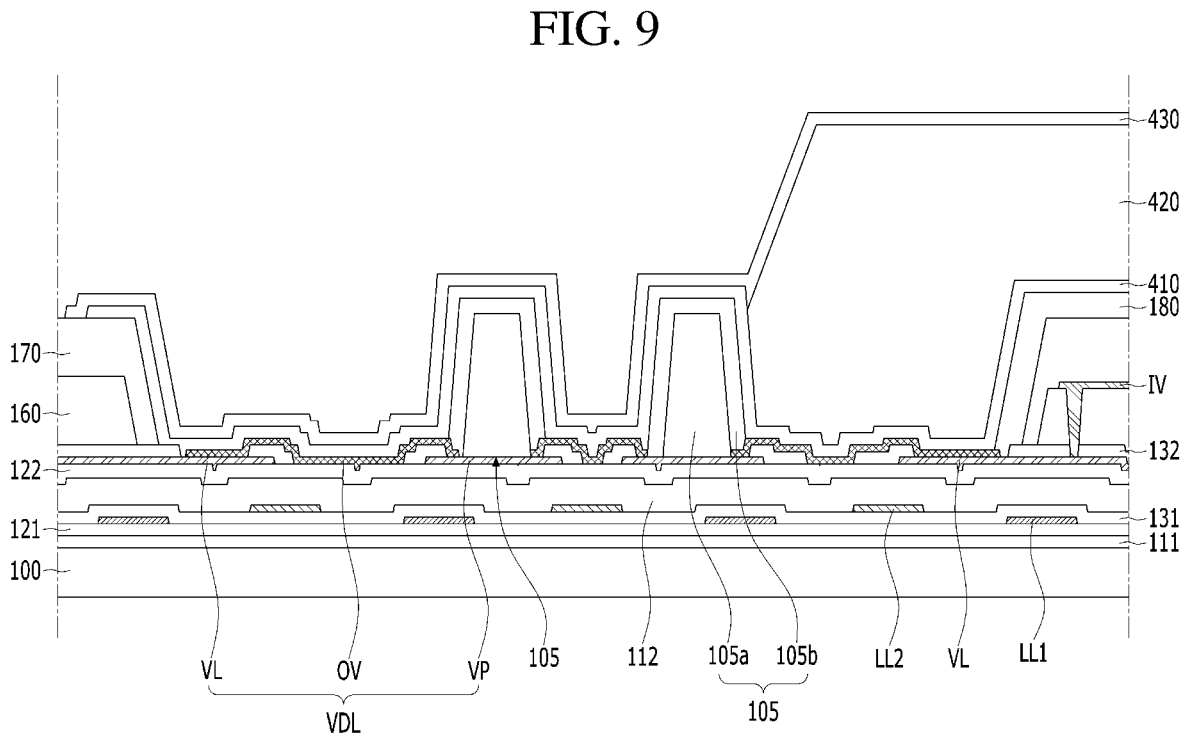

In the display apparatus according to another embodiment of the present disclosure, the gate driver on the bezel area BZ of the device substrate 100 may include at least one circuit thin film transistor 290, wherein the first semiconductor pattern 211 of the first thin film transistor T1 and the second semiconductor pattern 221 of the second thin film transistor T2 in each pixel area PA may be disposed on a layer different from a circuit semiconductor pattern 291 of the circuit thin film transistor 290, as shown in FIGS. 8 and 9. For example, in the display apparatus according to another embodiment of the present disclosure, the circuit semiconductor pattern 291 may be disposed between a lower buffer layer 111 and a lower gate insulating layer 121, a circuit gate electrode 293 of the circuit thin film transistor 290 on the lower gate insulating layer 121 may be covered by a lower interlayer insulating layer 131, and the first semiconductor pattern 211 of the first thin film transistor T1 and the second semiconductor pattern 221 of the second thin film transistor T2 in each pixel area PA may be disposed between an upper buffer layer 112 on the lower interlayer insulating layer 131 and an upper gate insulating layer 122 on the upper buffer layer 112. A circuit source electrode 295 and a circuit drain electrode 297 of the circuit thin film transistor 290 may be disposed on a same layer as the first source electrode 215 and the first drain electrode 217 of the first thin film transistor T1 in each pixel area PA. For example, the circuit source electrode 295 and the circuit drain electrode 227 may be disposed on an upper interlayer insulating layer 132 covering the first gate electrode 213 and the second gate electrode 223 of each pixel area PA.

The first semiconductor pattern 211 and the second semiconductor pattern 221 of each pixel area PA may include a material different from the circuit semiconductor pattern 291. For example, the circuit semiconductor pattern 291 may include a low-temperature Poly-Si (LTPS), and the first semiconductor pattern 211 and the second semiconductor pattern 221 of each pixel area PA may include an oxide semiconductor. A first light-blocking pattern 610 between the device substrate 100 and the first semiconductor pattern 211 and a second light-blocking pattern 620 between the device substrate 100 and the second semiconductor pattern 221 may be disposed in each pixel area PA. The first light-blocking pattern 610 may be electrically connected to the first gate electrode 213. The second light-blocking pattern 620 may be electrically connected to the second source electrode 225.

The first links LL1 may be disposed between the lower gate insulating layer 121 and the lower interlayer insulating layer 131. The second links LL2 may be disposed between the lower interlayer insulating layer 131 and the upper buffer layer 112. The main wiring VL of the first power voltage supply line VDL may be disposed between the upper gate insulating layer 122 and the upper interlayer insulating layer 132. An end of the main wiring VL and an end of the external dummy pattern VP may be covered by the upper interlayer insulating layer 132 around the encapsulating dam 105. The external connecting wiring OV may be disposed on the upper interlayer insulating layer 132. Thus, in the display apparatus according to another embodiment of the present disclosure, the degree of freedom for the pixel driving circuit DC of each pixel area PA may be improved.

In the result, the display apparatus according to the exemplary embodiments of the present disclosure may comprise the upper interlayer insulating layer between the link wirings electrically connected between the display area and the pad portion and the power voltage supply line, and the first dam pattern disposed on the upper interlayer insulating layer between the display area and the pad portion, wherein the power voltage supply line may include the main wiring spaced apart from the first dam pattern and the external connecting wiring electrically connected to the main wiring, and wherein the external connecting wiring may include a material different from the main wiring. That is, in the display apparatus according to the exemplary embodiments of the present disclosure, after removing the conductive material for forming the main wiring around the first dam pattern, the external connecting wiring electrically connected to the main wiring may be formed by a subsequent process. Thus, in the display apparatus according to the exemplary embodiments of the present disclosure, the generation of the residual layer due to the thickness difference generated by the link wirings in a process of forming the main wiring may be reduced or prevented. Thereby, in the display apparatus according to the exemplary embodiments of the present disclosure, the deterioration of the light-emitting devices due to the residual layer of the conductive material may be reduced or prevented. And, in the display apparatus according to the exemplary embodiments of the present disclosure, the production energy may be reduced by process optimization.

What is claimed is:
1. A display apparatus comprising:
a device substrate comprising a display area configured to display an image and a bezel area that does not display the image, the display area comprising a pixel area;
an upper planarization layer on the display area of the device substrate;
an upper interlayer insulating layer between the device substrate and the upper planarization layer, the upper interlayer insulating layer extending across the display area and the bezel area of the device substrate;

a first dam pattern on the upper interlayer insulating layer on the bezel area, the first dam pattern spaced apart from the upper planarization layer;

a light-emitting device on the pixel area of the display area, the light-emitting device including a first electrode, a light-emitting layer and a second electrode, wherein the first electrode is on the upper planarization layer, the light-emitting layer is on the first electrode, and the second electrode is on the light-emitting layer;

a pad portion on the bezel area of the device substrate;

link wirings between the device substrate and the upper interlayer insulating layer, wherein the link wirings extend across the display area and the bezel area and are electrically connected to the pad portion; and a power voltage supply line on the upper interlayer insulating layer, wherein the power voltage supply line extends across the display area and the bezel area, and is electrically connected to the pad portion, wherein the power voltage supply line includes:

a main wiring that is non-overlapping the first dam pattern on the bezel area, and an external connecting wiring electrically connected to the main wiring on the bezel area.

2. The display apparatus according to claim 1, wherein the external connecting wiring on the bezel area includes a first material, and the main wiring includes a second material that is different from the first material.

3. The display apparatus according to claim 1, further comprising:

a device passivation layer between the upper interlayer insulating layer and the upper planarization layer, wherein an end of the main wiring is covered by the device passivation layer, and the external connecting wiring is on the device passivation layer such that at least a portion of the device passivation layer is between the external connecting wiring and the upper interlayer insulating layer.

4. The display apparatus according to claim 1, wherein the first dam pattern and the upper planarization layer include a same material.

5. The display apparatus according to claim 4, wherein the external connecting wiring and the first electrode of the light-emitting device include a same material.

6. The display apparatus according to claim 4, wherein the external connecting wiring extends along a surface of the first dam pattern.

7. The display apparatus according to claim 6, further comprising:

a second dam pattern on the first dam pattern, wherein a portion of the external connecting wiring on the surface of the first dam pattern is covered by the second dam pattern such that the portion of the external connecting wiring is between the first dam pattern and the second dam pattern.

8. The display apparatus according to claim 1, wherein the power voltage supply line further includes an external dummy pattern between the upper interlayer insulating layer and the first dam pattern, and the external connecting wiring is electrically connected to the external dummy pattern.

9. The display apparatus according to claim 8, wherein the external connecting wiring is in direct contact with a portion of an upper surface of the main wiring that is farther from the device substrate than a lower surface of the main wiring and the external connecting wiring is in direct contact with a portion of an upper surface of the external dummy pattern that is farther from the device substrate than a lower surface of the external dummy pattern.

10. The display apparatus according to claim 8, wherein the external dummy pattern includes a same material as the main wiring.

11. The display apparatus according to claim 8, wherein the power voltage supply line extends in a first direction, the first dam pattern and the external dummy pattern extend in a second direction perpendicular to the first direction, and a width of the external dummy pattern in the first direction is greater than a width of the first dam pattern in the first direction.

12. The display apparatus according to claim 8, further comprising:

an auxiliary dummy pattern between the external dummy pattern and the first dam pattern, the auxiliary dummy pattern including a material that is different from a material of the external dummy pattern and a material of the external connecting wiring.

13. The display apparatus according to claim 1, further comprising:

a lower planarization layer between the upper interlayer insulating layer and the upper planarization layer, the lower planarization layer spaced apart from the first dam pattern; and an internal dummy wiring between the lower planarization layer and the upper planarization layer, wherein the main wiring is electrically connected to the internal dummy wiring at a location between the device substrate and the lower planarization layer.

14. The display apparatus according to claim 13, further comprising:

a pixel driving circuit between the pixel area of the device substrate and the lower planarization layer; and an intermediate electrode between the lower planarization layer and the upper planarization layer of the pixel area, the intermediate electrode electrically connected to the pixel driving circuit and the light-emitting device, wherein the intermediate electrode includes a same material as the internal dummy wiring.

15. The display apparatus according to claim 1, further comprising:

a lower interlayer insulating layer between the device substrate and the upper interlayer insulating layer, wherein the link wirings include first links between the device substrate and the lower interlayer insulating layer and second links between the lower interlayer insulating layer and the upper interlayer insulating layer, and wherein the second links are between the first links.

16. A display apparatus comprising:

a display area configured to display an image;

a bezel area surrounding the display area;

a pad portion in the bezel area;

at least one encapsulating dam in the bezel area, the at least one encapsulating dam extending along an edge of the display area; and a power voltage supply line electrically connecting the display area and the pad portion, wherein the power voltage supply line includes:

a main wiring non-overlapping the at least one encapsulating dam in the bezel area; and an external connecting wiring electrically connected to the main wiring in the bezel area.

17. A display apparatus comprising:

a substrate having a display area and a bezel area;

a light-emitting element in the display area on the substrate, the light-emitting element comprising a first electrode, a second electrode, and a light-emitting layer between the first electrode and the second electrode, the light-emitting layer configured to emit light for displaying an image in the display area;

a pad on the substrate in the bezel area;

a dam on the substrate in the bezel area;

a power voltage supply line extending from the display area to the pad and configured to provide power supplied from the pad to the display area, the power voltage supply line comprising:

a first wiring including a first end and a second end, the second end non-overlapping the dam; and a second wiring electrically connected to the second end of the first wiring.

18. The display apparatus of claim 17, wherein a first end of the second wiring overlaps the second end of the first wiring.

19. The display apparatus of claim 18, wherein the second wiring is non-overlapping the dam.

20. The display apparatus of claim 17, further comprising:

a plurality of link wirings extending across the display area and the bezel area, the plurality of link wirings electrically connected to the pad; and an insulating layer between the plurality of link wirings and the power voltage supply line.

21. The display apparatus of claim 20, wherein the insulating layer and the dam comprise a same material.

22. The display apparatus of claim 17, wherein the second wiring includes a first material, and the first wiring includes a second material that is different from the first material.

23. The display apparatus of claim 17, further comprising:

a third wiring that is electrically connected to the second wiring.

24. The display apparatus of claim 23, wherein the third wiring overlaps the dam.

25. The display apparatus of claim 23, further comprising:

a fourth wiring electrically connected to the third wiring, the fourth wiring between the dam and the third wiring.

26. The display apparatus of claim 25, wherein the dam comprises a first dam pattern and a second dam pattern, the first dam pattern is on the fourth wiring, a portion of the second wiring extends over the first dam pattern, and the second dam pattern is on the portion of the second wiring that overlaps the first dam pattern, the third wiring, and the fourth wiring.

27. The display apparatus of claim 17, wherein the dam comprises a first dam pattern and a second dam pattern, and a portion of the second wiring extends over the first dam pattern such that the portion of the second wiring is between the first dam pattern and the second dam pattern.

* * * * *